United States Patent
Shah et al.

(10) Patent No.: US 10,232,324 B2
(45) Date of Patent: Mar. 19, 2019

(54) GAS MIXING APPARATUS

(71) Applicant: APPLIED MATERIALS, INC., Santa Clara, CA (US)

(72) Inventors: Kartik Shah, Sunnyvale, CA (US); Kalyanjit Ghosh, Bangalore (IN); Scott McClelland, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 245 days.

(21) Appl. No.: 13/918,033

(22) Filed: Jun. 14, 2013

(65) Prior Publication Data

US 2014/0014270 A1    Jan. 16, 2014

Related U.S. Application Data

(60) Provisional application No. 61/670,654, filed on Jul. 12, 2012.

(51) Int. Cl.
*B01F 3/02* (2006.01)
*B01F 5/00* (2006.01)
(Continued)

(52) U.S. Cl.
CPC .............. *B01F 3/026* (2013.01); *B01F 3/02* (2013.01); *B01F 5/0057* (2013.01);
(Continued)

(58) Field of Classification Search
CPC ........ B01F 3/026; B01F 3/02; C23C 16/4558; C23C 16/45512; C23C 16/45561; C23C 16/4559; H01J 37/3244; H01J 37/32449
(Continued)

(56) References Cited

U.S. PATENT DOCUMENTS 4,520,757 A * 6/1985 Nath ............... C23C 16/455
                                                  118/718
5,573,334 A * 11/1996 Anderson .......... 366/162.4
(Continued)

FOREIGN PATENT DOCUMENTS

JP    H02-161724 A    6/1990
JP    H04-080366 A    3/1992
(Continued)

OTHER PUBLICATIONS

International Search Report and Written Opinion dated Sep. 27, 2013 for PCT Application No. PCT/US2013/048855.

*Primary Examiner* — Gordon Baldwin
*Assistant Examiner* — Mirza Israr Javed
(74) *Attorney, Agent, or Firm* — Moser Taboada; Alan Taboada

(57) ABSTRACT

Embodiments of gas mixing apparatus are provided herein. In some embodiments, a gas mixing apparatus may include a container defining an interior volume, the container having a closed top and bottom and a sidewall having a circular cross section with respect to a central axis of the container passing through the top and bottom; a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container; and an outlet coupled to the container proximate the bottom of the container to allow the plurality of process gases to be removed from the interior volume of the container.

17 Claims, 6 Drawing Sheets

(51) Int. Cl.
  *B01F 5/06* (2006.01)
  *H01J 37/32* (2006.01)
(52) U.S. Cl.
  CPC .......... *B01F 5/0065* (2013.01); *B01F 5/0616* (2013.01); *B01F 5/0618* (2013.01); *H01J 37/3244* (2013.01); *H01J 37/32449* (2013.01); *B01F 2005/0636* (2013.01)
(58) Field of Classification Search
  USPC ................................................ 118/715–733
  See application file for complete search history.

(56) References Cited

U.S. PATENT DOCUMENTS

| | | | |
|---|---|---|---|
| 6,933,010 B2 | 8/2005 | Yamada et al. | |
| 7,017,514 B1* | 3/2006 | Shepherd et al. | 118/723 ME |
| 9,312,154 B2 | 4/2016 | Tran et al. | |
| 2003/0205096 A1* | 11/2003 | Gehner et al. | 73/863 |
| 2005/0252449 A1* | 11/2005 | Nguyen et al. | 118/715 |
| 2006/0042754 A1* | 3/2006 | Yoshida et al. | 156/345.1 |
| 2008/0107809 A1* | 5/2008 | Wu et al. | 427/248.1 |
| 2008/0202425 A1* | 8/2008 | Gelatos et al. | 118/724 |
| 2008/0230518 A1 | 9/2008 | Brillhart et al. | |
| 2009/0162260 A1* | 6/2009 | Bera | H01J 37/321 422/186.04 |
| 2011/0203560 A1 | 8/2011 | Wallace | |
| 2013/0082410 A1* | 4/2013 | Goodwin et al. | 261/42 |

FOREIGN PATENT DOCUMENTS

| | | |
|---|---|---|
| JP | H06-010138 A | 1/1994 |
| JP | 07-211643 A | 8/1995 |
| JP | 2003-133300 A | 5/2003 |
| JP | 2003-239072 A | 8/2003 |
| JP | 2004-323894 A | 11/2004 |
| JP | 2007-335755 A | 12/2007 |
| KR | 10-2000-0061954 A | 10/2000 |
| WO | WO 2007/075509 A2 | 7/2007 |
| WO | WO 2010/079766 A1 | 7/2010 |

* cited by examiner

GAS MIXING APPARATUS

CROSS-REFERENCE TO RELATED APPLICATIONS

This application claims benefit of U.S. provisional patent application Ser. No. 61/670,654, filed Jul. 12, 2012, which is herein incorporated by reference.

FIELD

Embodiments of the present invention generally relate to semiconductor processing equipment.

BACKGROUND

The inventors have observed that many conventional gas delivery systems utilized to deliver multiple process gases to a process chamber can fail to provide a uniform mixture of the process gases to the process chamber. Such a lack in uniformity in a process gas mixture leads to areas of the process chamber receiving higher concentrations of individual components of the process gases, thereby resulting in process non-uniformities.

Therefore, the inventors have provided an improved gas mixing apparatus.

SUMMARY

Embodiments of gas mixing apparatus are provided herein. In some embodiments, a gas mixing apparatus may include a container defining an interior volume, the container having a closed top and bottom and a sidewall having a circular cross section with respect to a central axis of the container passing through the top and bottom; a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container; and an outlet coupled to the container proximate the bottom of the container to allow the plurality of process gases to be removed from the interior volume of the container.

In some embodiments, an apparatus for processing substrates may include a process chamber having a processing volume; a substrate support disposed within the processing volume; and a gas mixing apparatus coupled to the process chamber to provide a mixture of process gases to the processing volume of the process chamber. The gas mixing apparatus may include a container defining an interior volume, the container having a closed top and bottom and a sidewall having a circular cross section with respect to a central axis of the container passing through the top and bottom; a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container; and an outlet coupled to the container proximate the bottom of the container to allow the plurality of process gases to be removed from the interior volume of the container.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
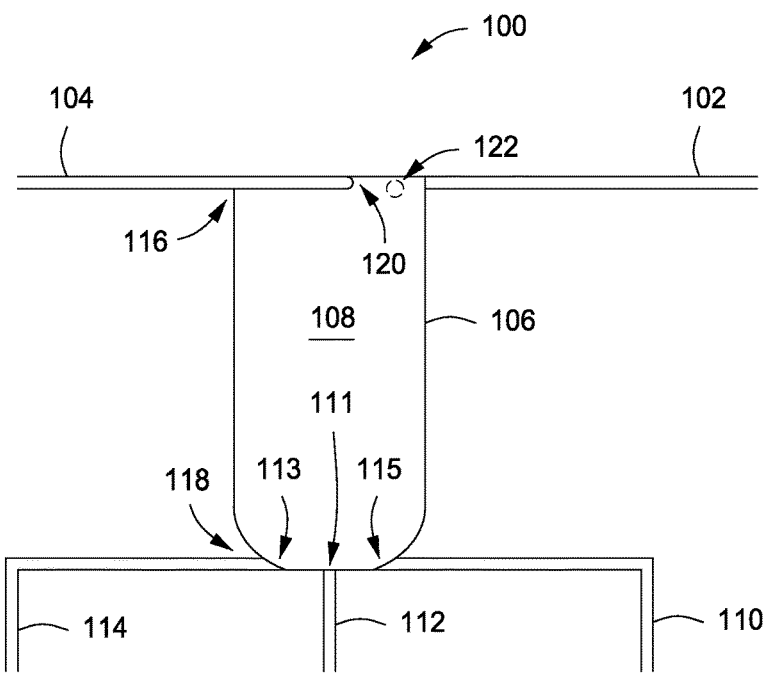
FIG. 1 is a schematic side view of a gas mixing apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of gas mixing apparatus are provided herein. In some embodiments, the inventive gas mixing apparatus may advantageously provide a more uniform mixture of process gases and/or a more uniform plasma to a process chamber as compared to convention gas delivery systems.

The inventors have observed that certain semiconductor processes require sufficient mixing of multiple process gases to avoid process non-uniformities. For example, in a seasoning process utilized to clean and/or condition a process chamber in preparation for processing a substrate, a uniform mixture of process gases is typically required to generate a uniform plasma to properly clean the process chamber. However, the inventors have observed that conventional gas delivery systems utilized to deliver multiple process gases to a process chamber can fail to provide a uniform mixture of the process gases to the process chamber, thereby leading to process non-uniformities.

Accordingly, the inventors have provided embodiments of an improved gas mixing apparatus to deliver multiple process gases to a process chamber. For example, FIG. 1 is a schematic side view of a gas mixing apparatus in accordance with some embodiments of the present invention. In some embodiments, the gas mixing apparatus 100 may generally comprise a container 106, a plurality of inlets (e.g., a plurality of first inlets) and a first outlet 111. As depicted in FIG. 1, first inlet 120 and second inlet 122 are shown. A conduit is coupled to each of the plurality of inlets to facilitate delivery of a gas and/or plasma from a gas source and/or plasma source. For example, in some embodiments, a first conduit 104 may be coupled to the first inlet 120 and a second conduit 102 may be coupled to the second inlet 122, as shown in FIG. 1.

Figure 3:
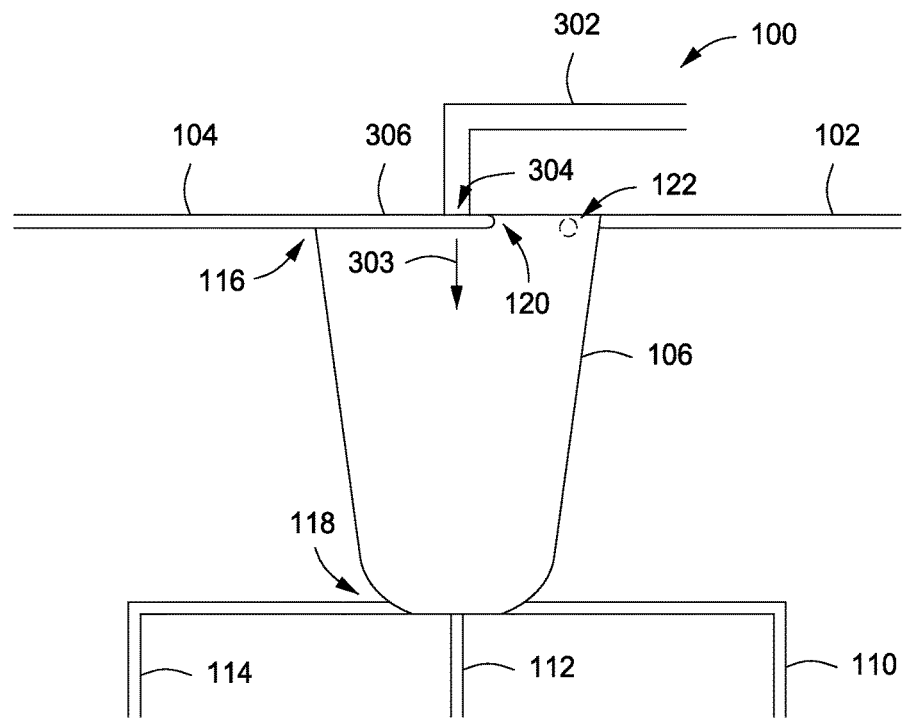
FIG. 3 is a schematic side view of a gas mixing apparatus in accordance with some embodiments of the present invention.

In some embodiments, the container 106 includes a sidewall with a closed top 116 and bottom 118, thereby defining an inner volume 108. The container 106 may have any shape suitable to allow a desired amount of mixing of the process gas and/or plasma provided to the container 106. In some embodiments, the inner volume of container 106 may have a circular cross section. By providing a circular cross section, the inventors have observed that the process gas and/or plasma provided to the container 106 may flow in a circular or spiral manner, thereby allowing the process gas and/or plasma to mix prior to flowing out of the container via the first outlet 111. In some embodiments, the bottom 118 of the container 106 may be flat. Alternatively, in some embodiments, the bottom 118 of the container 106 may be curved or substantially bowl shaped, such as shown in FIG. 1. In some embodiments, the container 106 may be substantially cylindrical, as depicted in FIG. 1. Alternatively, in some embodiments, the container 106 may be conical or frustoconical, for example, as shown in FIG. 3. In such embodiments, a diameter of the container 106 proximate the top 116 of the container may be greater than a diameter of the container 106 proximate the bottom 118 of the container 106.

Referring back to FIG. 1, the container 106 may have any dimensions suitable to provide a suitable residence time of process gases and/or plasma within the container 106 to facilitate a desired mixing of process gases and/or plasma. For example, in some embodiments, the container 106 may have an inner diameter of about 14.3 mm to about 18.6 mm. In some embodiments, the container may have a height of about 38.3 mm to about 58.7 mm.

The container 106 may be fabricated from any process compatible material, for example any material that is non-reactive to the process gas or plasma provided to the container 106. For example, in some embodiments, the container 106 may be fabricated from a metal, such as stainless steel, aluminum, or the like.

In some embodiments, an outlet (e.g., the first outlet 111) is disposed proximate the bottom 118 of the container 106 and allows the process gas and/or plasma to flow out of the container 106. The container 106 may have a plurality of outlets to facilitate delivery of the contents of the container 106 to a corresponding plurality of gas delivery zones within a process chamber. For example, in some embodiments, the container 106 may have two or more outlets, such as three outlets (first outlet 111, second outlet 113 and third outlet 115 shown), as shown in FIG. 1. In such embodiments, a conduit may be respectively coupled to each outlet to facilitate delivery of the mixed process gas and/or plasma, for example, to a plurality of gas delivery zones of a process chamber. For example, a first conduit 112, second conduit 114, and third conduit 110 may be respectively coupled to the first outlet 111, second outlet 113 and third outlet 115.

Although only two inlets (i.e., first inlet 120 and second inlet 122) are shown in FIG. 1, the container 106 may include any number of inlets suitable to accommodate for any number of process gases and/or plasmas that are to be provided to the container 106. For example, referring to FIG. 2, in some embodiments, the container 106 may have four inlets (i.e., first inlet 120, second inlet 122, third inlet 206 and fourth inlet 208 shown). In such embodiments, similar to the first inlet 120 and second inlet 122 discussed above, the third inlet 206 and fourth inlet 208 each have a conduit coupled thereto (e.g., third conduit 202 and fourth conduit 204 coupled to the third inlet 206 and fourth inlet 208, respectively) to facilitate delivery of the gas and/or plasma from the gas and/or plasma source.

Figure 2:
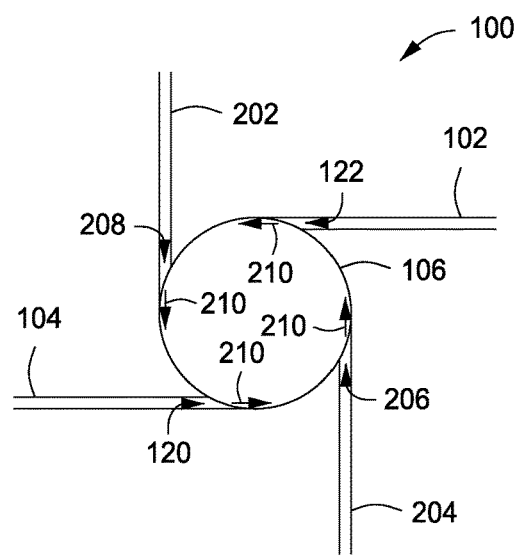
FIG. 2 is a schematic top view of a gas mixing apparatus in accordance with some embodiments of the present invention.

The plurality of inlets (e.g., first inlet 120, second inlet 122, third inlet 206 and fourth inlet 208) may be disposed about the container 106 in any configuration suitable to provide a desired flow of process gas and/or plasma within the container 106. For example, in some embodiments, each of the first inlet 120, second inlet 122, third inlet 206 and fourth inlet 208 may be disposed about the container 106 such the process gas and/or plasma is provided having a flow direction that is tangential to the cross section of the container 106 (as indicated by arrows 210), such as shown in FIG. 2. By providing the flow in such a manner, the inventors have observed that the process gas and/or plasma mixes more completely prior to flowing out of the container via the outlets (e.g., first outlet 111, second outlet 113 and third outlet 115 described above). The inventors believe that the circular cross section of the container 106 and the tangential flow of the process gas and/or plasma cause the process gas and/or plasma to flow in a circular or spiral manner. Such a circular or spiral flow may increase the residence time of the process gas and/or plasma within the container and the turbulence of the process gas and/or plasma, thereby facilitating the mixing of the process gas and/or plasma. In some embodiments, the process gas and/or plasma may be mixed up to 100% mixing (i.e., a complete, or uniform mixing of components).

Figure 4:
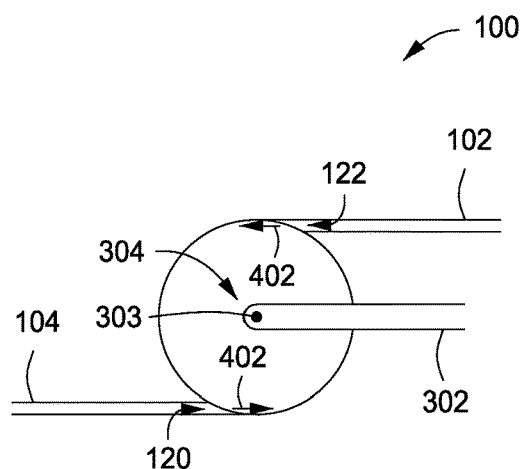
FIG. 4 is a schematic top view of a gas mixing apparatus in accordance with some embodiments of the present invention.

Alternatively or in combination, in some embodiments and as depicted in FIG. 3, an additional inlet 304 (e.g., a second inlet) may be coupled to the top 306 of the container 106 and configured to provide a flow of process gas and/or plasma in a direction substantially perpendicular to the top 306 of the container 106 (as indicated by arrow 303). In some embodiments, the additional inlet 304 may be utilized to provide a plasma formed in a remote plasma source to the container 106 via an additional conduit 302 while the first inlet 120 and second inlet 122 provide a process gas from a gas source coupled to the first and second inlets 120, 122. For example, in some embodiments the gas mixing apparatus 100 may be coupled to a process chamber (such as in a non-limiting example, a plasma ion immersion implantation reactor, as described below with respect to FIG. 8) to provide a mixture of process gases and plasma to perform a seasoning process within the process chamber. In such embodiments, a silicon containing gas for example, silane ($SiH_4$), may be provided to the container 106 via the first inlet 120, an oxygen containing gas, for example, oxygen gas ($O_2$), may be provided to the container 106 via the second inlet 122 and an argon (Ar) containing plasma may be provided to the container 106 via the additional inlet 304. When provided in such a configuration, the gases provided via the first inlet 120 and the second inlet 122 may be provided in a direction tangential to the cross section of the container 106 (as indicated by arrows 210 in FIG. 2, or arrows 402 in FIG. 4) and the plasma provided via the additional inlet 304 may be provided in a direction substantially perpendicular to the top 306 of the container 106 (as indicated by arrow 303, as shown in FIG. 3).

In some embodiments, one or more additional components may be provided within the container 106 to enhance the mixing of the process gases and/or plasma. For example, referring to FIG. 5, in some embodiments, a plurality of baffles 501 may be disposed within the container 106. The inventors believe that, when present, the plurality of baffles 501 may increase residence time and turbulence of the flow of the process gases and/or plasma, thereby enhancing the mixing of the process gases and/or plasma.

Figure 5:
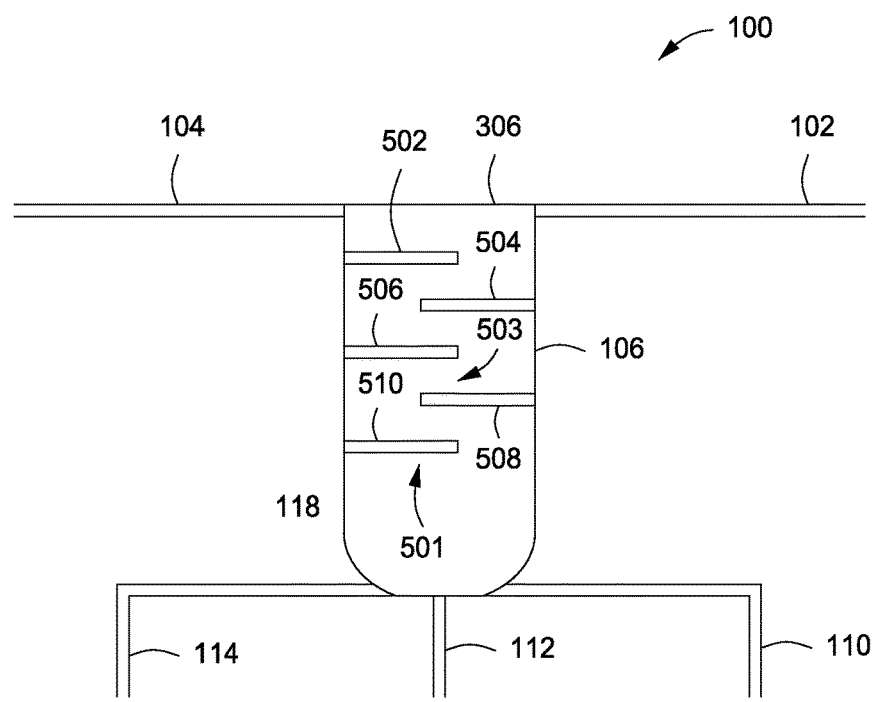
FIG. 5 is a schematic cross sectional side view of a gas mixing apparatus in accordance with some embodiments of the present invention.

The plurality of baffles 501 may be provided in any number or configuration sufficient to increase the aforementioned residence time and turbulence of the flow of the process gases and/or plasma. For example, in some embodiments, the plurality of baffles 501 may comprise one or more baffles (first baffle 502, second baffle 504, third baffle 506, fourth baffle 508 and fifth baffle 510 shown) extending from a wall 505 of the container 106 towards a center 503 of the container 106. In some embodiments, the baffles may extend beyond an axial centerline of the container 106, for example to advantageously maximize the flow path, and therefore residence time, of the gases in the container 106. In some embodiments, the baffles may be disposed substantially parallel with the top 306 of the container 106, such as shown in FIG. 5. In some embodiments, each of a plurality of baffles 501 may be disposed such that each baffle is staggered with an adjacent baffle, such as, for example, by being disposed on opposite sides of the container 106. In some embodiments, each of the plurality of baffles 501 may have a height of about 0.5 mm to about 1 mm, or in some embodiments, about 1 mm.

Figure 6:
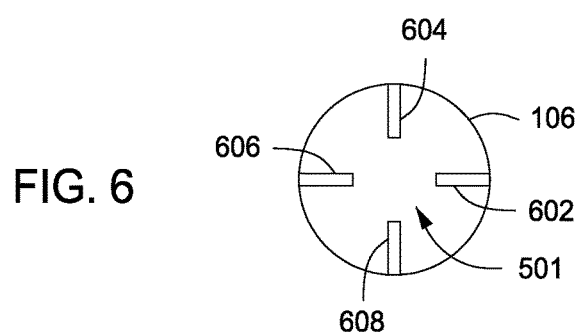
FIG. 6 is a schematic cross sectional top view of a gas mixing apparatus in accordance with some embodiments of the present invention.
Figure 7:
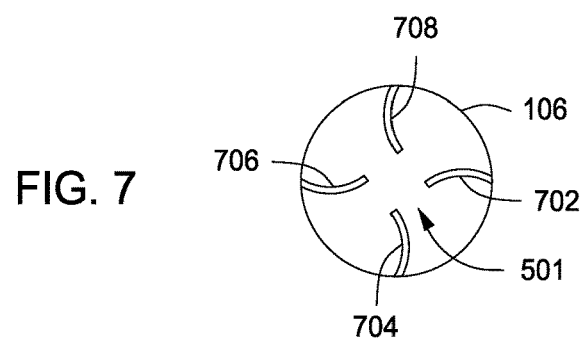
FIG. 7 is a schematic cross sectional top view of a gas mixing apparatus in accordance with some embodiments of the present invention.

Alternatively, or in combination, in some embodiments, at least some of the plurality of baffles 501 may be disposed substantially perpendicular to the top of the container 106, for example, such as the first baffle 602, second baffle 604, third baffle 606, and fourth baffle 608 shown in FIG. 6. In some embodiments, the plurality of baffles 501 may be flat, as depicted in FIG. 6, or may have a curved shape, such as the first baffle 702, second baffle 704, third baffle 706, and fourth baffle 708 shown in FIG. 7. In some embodiments, each of the plurality of baffles may have a height of about 0.5 mm to about 1 mm, or in some embodiments, about 10 mm.

The gas mixing apparatus 100 described above may be utilized to provide a mixture of process gases and/or plasma to any type of processing equipment used to perform processes on a substrate. For example, the gas mixing apparatus 100 may be coupled to a toroidal source plasma ion immersion implantation reactor such as, but not limited to, the CONFORMA™ reactor commercially available from Applied Materials, Inc., of Santa Clara, Calif. Other process chambers, including those configured for other processes as well as those available from other manufacturers, may also benefit from modification in accordance with the teachings provided herein.

Figure 8:
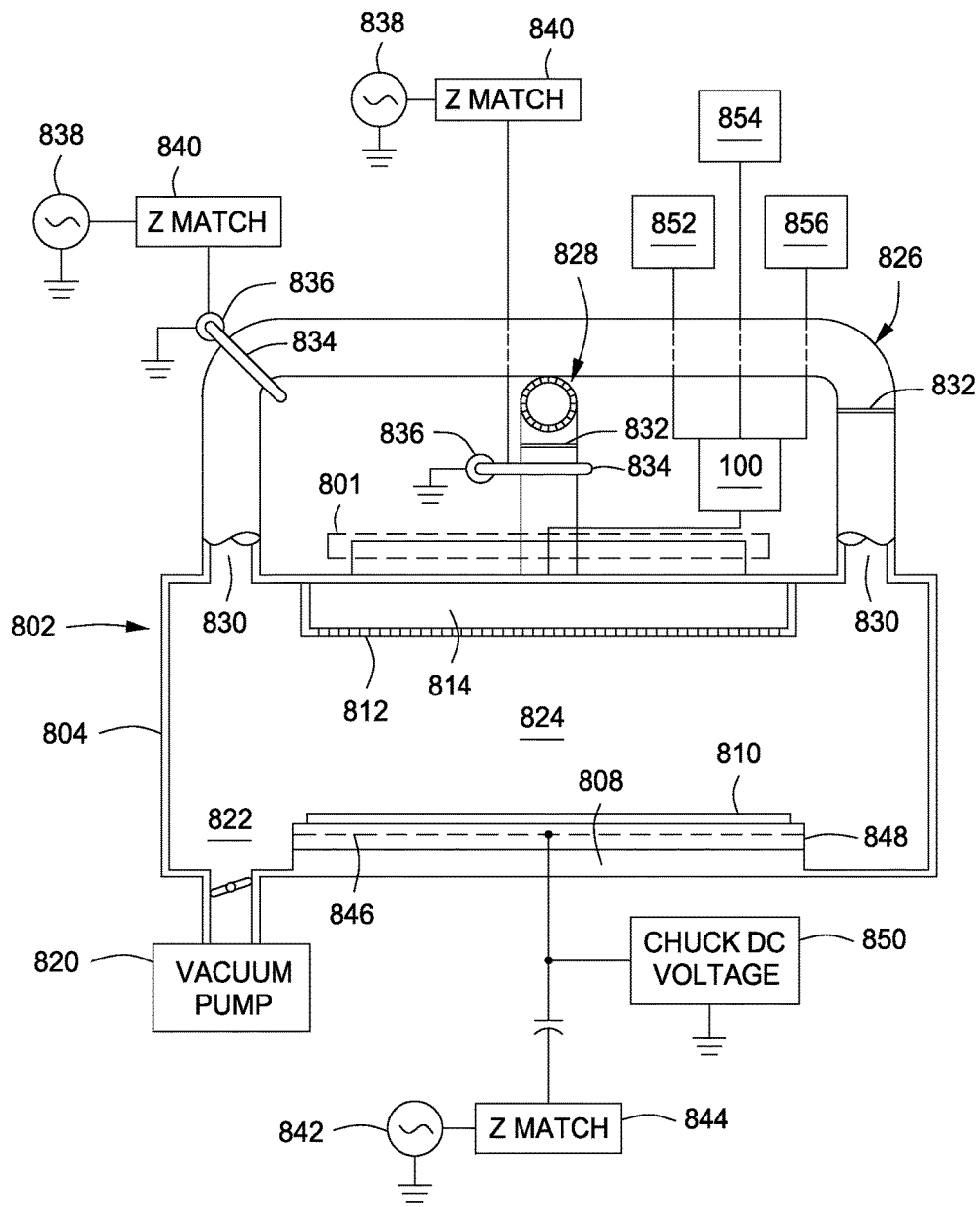
FIG. 8 depicts a schematic side view of a process chamber suitable for use with a gas mixing apparatus in accordance with some embodiments of the present invention.

Referring to FIG. 8, a toroidal source plasma immersion ion implantation reactor 800 may generally comprise a cylindrical vacuum chamber 802 defined by a cylindrical sidewall 804 and a disk-shaped ceiling 806. A substrate support pedestal 808 at the floor of the chamber 802 supports a substrate 810 to be processed. A gas distribution plate or showerhead 812 on the ceiling 806 receives process gas in its gas manifold 814 from the gas mixing apparatus 100.

A plurality of gas and/or plasma sources (three sources 852, 854, 856 shown) may be coupled to the gas mixing apparatus 100 to provide process gases and/or plasma to the gas mixing apparatus 100 to be mixed and subsequently provided to the chamber 802. In some embodiments, the gas mixing apparatus 100 may be coupled to an upper manifold 801 disposed above, and coupled to the chamber 802 to distribute the mixed process gases and/or plasma to desired gas delivery zones or regions of the process chamber. In some embodiments, the upper manifold 801 may be coupled directly to the interior of the process chamber or to a lower manifold (e.g., gas distribution plate or showerhead 812) disposed within the chamber 802.

Figure 9:
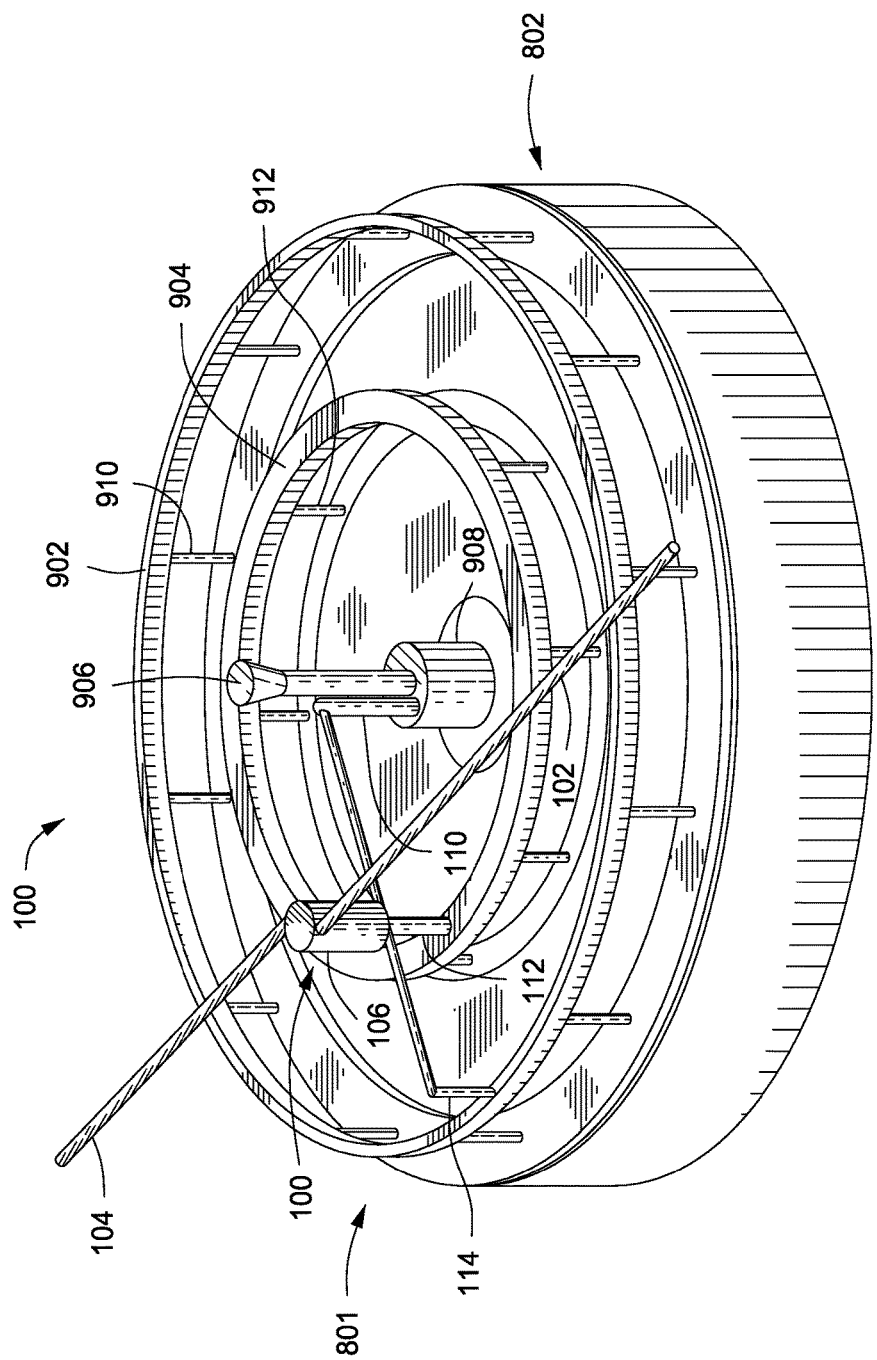
FIG. 9 depicts a top perspective view of a portion of a process chamber suitable for use with a gas mixing apparatus in accordance with some embodiments of the present invention.

Referring to FIG. 9, in some embodiments, the upper manifold 801 may include a plurality of manifolds. For example, in some embodiments, the plurality of manifolds may include a plurality of gas rings, such as an inner gas ring 904 and an outer gas ring 902, as well as a central injection port 908. Each of the inner gas ring 904 and outer gas ring 902 may comprise a plurality of gas outlets (e.g., a plurality of third gas outlets). Gas outlets 910 are shown for outer gas ring 902 and gas outlets 912 are shown for inner gas ring 904 in FIG. 9. The gas outlets 910, 912 are coupled to the chamber 802 and facilitate delivery of the process gas and/or plasma from the inner gas ring 904 and outer gas ring 902 to the interior of the chamber 802 (e.g., via the gas distribution plate or showerhead 812 described above).

The gas mixing apparatus 100 may be coupled to the upper manifold 801 in any position relative to the upper manifold 801 that is suitable to provide a desired mix of process gas and/or plasma to a desired location within the chamber 802.

For example, in some embodiments, the gas mixing apparatus 100 may be disposed above the inner gas ring 904, wherein the first conduit 112 is coupled to the inner gas ring 904, the second conduit 114 is coupled to the outer gas ring 902 and the third conduit 110 is coupled to the central injection port 908, such as shown in FIG. 9. In such embodiments, an additional conduit 906 may be coupled to the central injection port 908 to facilitate separate delivery of, for example, a plasma from a remote plasma source.

Figure 10:
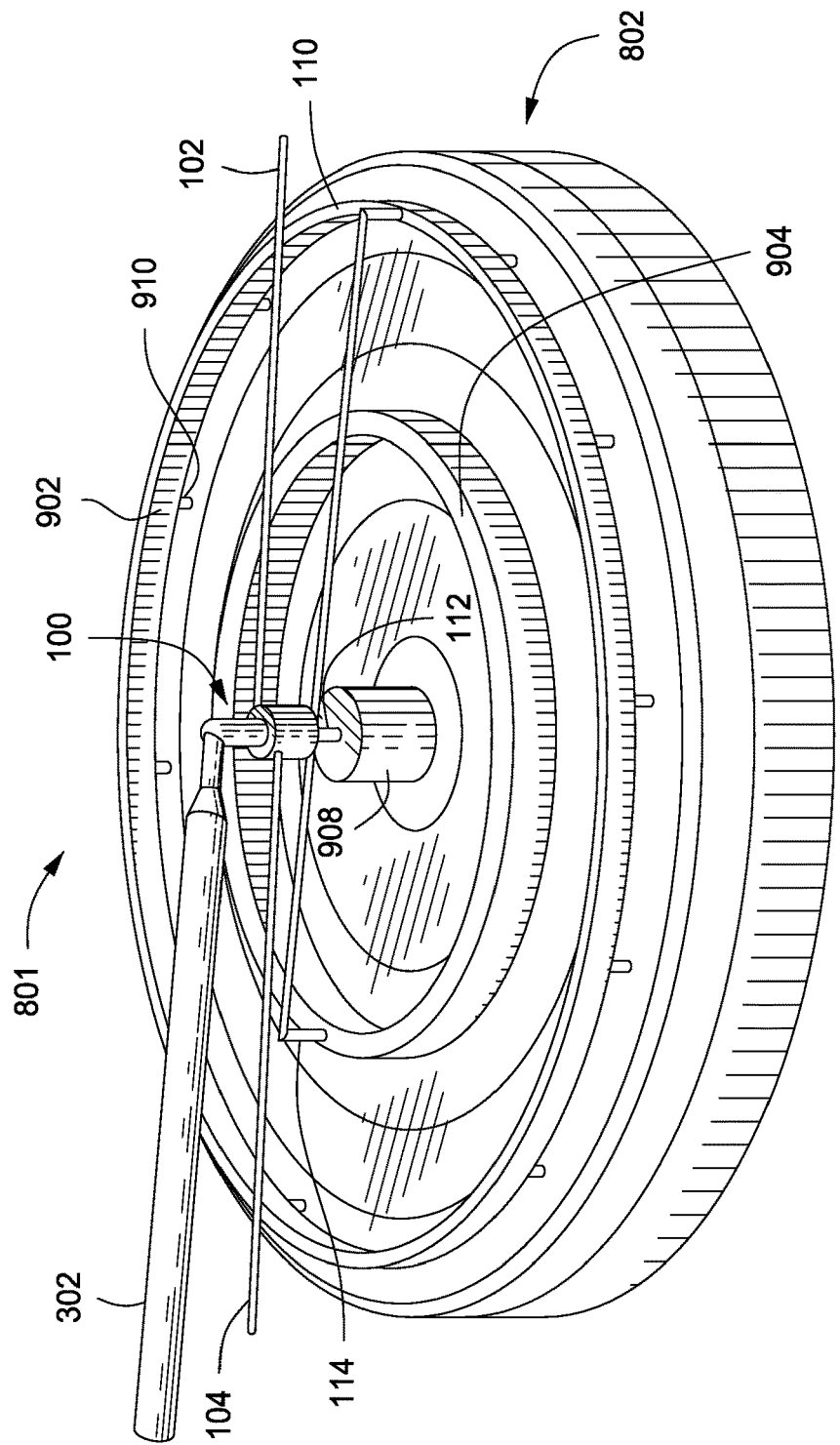
FIG. 10 depicts a top perspective view of a portion of a process chamber suitable for use with a gas mixing apparatus in accordance with some embodiments of the present invention.

Alternatively, in some embodiments, the gas mixing apparatus 100 may be disposed above the central injection port 908, wherein the first conduit 112 is coupled to the central injection port 908, the second conduit 114 is coupled to the inner gas ring 904 and the third conduit 110 is coupled to the outer gas ring 902, such as shown in FIG. 10. In such embodiments, a plasma from a plasma remote source may be provided to the gas mixing apparatus 100 via the additional conduit 302.

Referring back to FIG. 8, a vacuum pump 820 is coupled to a pumping annulus 822 defined between the substrate support pedestal 808 and the sidewall 804. A processing region 824 is defined between the substrate 810 and the gas distribution plate or showerhead 812.

A pair of external reentrant conduits 826, 828 establishes reentrant toroidal paths for plasma currents passing through the processing region 824, and the toroidal paths intersecting in the processing region 824. Each of the conduits 826, 828 has a pair of ends 830 coupled to opposite sides of the chamber. Each conduit 826, 828 is a hollow conductive tube. Each conduit 826, 828 has a D.C. insulation ring 832 preventing the formation of a closed loop conductive path between the two ends of the conduit.

An annular portion of each conduit 826, 828, is surrounded by an annular magnetic coil 834. An excitation coil 836 surrounding the coil 834 is coupled to an RF power source 838 through an impedance match device 840. The two RF power sources 838 coupled to respective ones of the coils 836 may be of two slightly different frequencies. The RF power coupled from the RF power sources 838 produces plasma ion currents in closed toroidal paths extending through the respective conduit 826, 828 and through the processing region 824. These ion currents oscillate at the frequency of the respective RF power source 838. Bias power is applied to the substrate support pedestal 808 by an RF bias power generator 842 through an impedance match circuit 844.

Plasma formation is performed by introducing a process gas, or mixture of process gases into the chamber 802 through the gas distribution plate or showerhead 812 and applying sufficient source power from the sources 838 to the reentrant conduits 826, 828 to create toroidal plasma currents in the conduits and in the processing region 824.

The plasma flux proximate the wafer surface is determined by the wafer bias voltage applied by the RF bias power generator 842. The plasma rate or flux (number of ions sampling the wafer surface per square cm per second) is determined by the plasma density, which is controlled by the level of RF power applied by the RF power sources 838. The cumulative ion dose (ions/square cm) at the substrate 810 is determined by both the flux and the total time over which the flux is maintained.

If the substrate support pedestal 808 is an electrostatic chuck, then a buried electrode 846 is provided within an insulating plate 848 of the wafer support pedestal, and the buried electrode 846 is coupled to the RF bias power generator 842 through the impedance match circuit 844 and/or a DC voltage source 850.

In operation, and for example, the substrate 810 may be placed on the substrate support pedestal 808 and one or more process gases may be introduced into the chamber 802 to strike a plasma from the process gases. For example, a plasma may be generated from the process gases within the reactor 800 to selectively modify surfaces of the substrate 810 as discussed above. The plasma is formed in the processing region 824 by applying sufficient source power from the RF power sources 838 to the reentrant conduits 826, 828 to create plasma ion currents in the conduits 826, 828 and in the processing region 824 in accordance with the process described above. In some embodiments, the wafer bias voltage delivered by the RF bias power generator 842 can be adjusted to control the flux of ions to the wafer surface, and possibly one or more of the thickness a layer formed on the wafer or the concentration of plasma species embedded in the wafer surface.

A controller comprises a central processing unit (CPU), a memory, and support circuits for the CPU and facilitates control of the components of the chamber 802 and, as such, of the etch process, as discussed below in further detail. To facilitate control of the chamber 802, for example as described below, the controller may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The inventive methods, or at least portions thereof, described herein may be stored in the memory as a software routine. The software routine may also be stored and/or executed by a second CPU (not shown) that is remotely located from the hardware being controlled by the CPU.

Thus, embodiments of gas mixing apparatus have been provided herein that may advantageously provide enhanced mixing of process gases and/or plasma being provided to one or more gas delivery zones.

While the foregoing is directed to embodiments of the present invention, other and further embodiments of the invention may be devised without departing from the basic scope thereof.

The invention claimed is:

1. A gas mixing apparatus, comprising:
a container defining an interior volume, the container having a top and bottom and a sidewall having a circular cross section with respect to a central axis of the container passing through the top and bottom;
a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container;
an outlet coupled to the container proximate the bottom of the container to allow the plurality of process gases to be removed from the interior volume of the container; and
a plurality of baffles disposed within the container, wherein each of the plurality of baffles are substantially planar and parallel to the top of the container, and wherein each baffle of the plurality of baffles extend from the sidewall of the container past the central axis of the container and terminate prior to reaching an opposite side of the container.

2. The gas mixing apparatus of claim 1, further comprising a plurality of gas sources respectively coupled to the plurality of first inlets.

3. The gas mixing apparatus of claim 2, wherein at least one of the plurality of gas sources provides a gas in a plasma state.

4. The gas mixing apparatus of claim 1, further comprising:
a second inlet coupled to a top of the container to provide a second process gas to the container, the second inlet disposed such that a flow path of the second process gas through the second inlet is substantially perpendicular to the top of the container.

5. The gas mixing apparatus of claim 4, further comprising a second gas source coupled to the second inlet.

6. The gas mixing apparatus of claim 1, wherein the bottom of the container is bowl-shaped, the bowl having an inclined wall extending downwardly and inwardly away from the interior volume, wherein the outlet is coupled to the bottom.

7. The gas mixing apparatus of claim 1, wherein the container has a conical shape, wherein a diameter of the container continuously decreases from the top of the container to the bottom of the container.

8. The gas mixing apparatus of claim 1, wherein each baffle of the plurality of baffles is staggered with respect to an adjacent baffle of the plurality of baffles.

9. A gas mixing apparatus, comprising:
a container defining an interior volume, the container having a top and bottom and a sidewall having a circular cross section with respect to a central axis of the container passing through the top and bottom;

a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container;

an outlet coupled to the container proximate the bottom of the container to allow the plurality of process gases to be removed from the interior volume of the container; and a plurality of baffles disposed within the container, wherein the plurality of baffles are disposed substantially perpendicular to the top of the container along an elongate axis of each baffle and extend from a wall of the container toward the central axis of the container.

10. The gas mixing apparatus of claim 9, wherein the plurality of baffles are curved along an axis that is perpendicular to the top of the container.

11. The gas mixing apparatus of claim 1, further comprising:
a plurality of outlets coupled to the container proximate the bottom of the container; and
a plurality of gas rings, each having a plurality of third gas outlets, wherein the container is fluidly coupled to the plurality of gas rings via the plurality of outlets.

12. The gas mixing apparatus of claim 11, wherein the plurality of gas rings comprise a central injection port, an inner gas ring disposed about the central injection port, and an outer gas ring disposed about the inner gas ring.

13. The gas mixing apparatus of claim 11, wherein the plurality of outlets are fluidly coupled to a lower manifold disposed within a process chamber, the lower manifold having a plurality of gas dispersion holes to provide the plurality of process gases to an inner volume of the process chamber.

14. An apparatus for processing substrates, comprising:
a process chamber having a processing volume;
a substrate support disposed within the processing volume; and
a gas mixing apparatus coupled to the process chamber to provide a mixture of process gases to the processing volume of the process chamber, the gas mixing apparatus comprising:

a container defining an interior volume, the container having a closed top and bottom and a sidewall having a circular cross section with respect to a central axis of the container passing through the top and bottom;

a plurality of first inlets coupled to the container proximate the top of the container to provide a plurality of process gases to the interior volume of the container, the plurality of first inlets disposed such that a flow path of the plurality of process gases through the plurality of first inlets is substantially tangential to the sidewall of the container;

an outlet coupled to the container proximate the bottom of the container to allow the plurality of process gases to be removed from the interior volume of the container, wherein the outlet is coupled to the processing volume via a conduit; and a second inlet coupled to a top of the container to provide a second process gas to the container, the second inlet disposed such that a flow path of the second process gas through the second inlet is substantially perpendicular to the top of the container.

15. The apparatus for processing substrates of claim 14, wherein the bottom of the container is one of:
bowl-shaped, the bowl having an inclined wall extending downwardly and inwardly away from the interior volume; or
conically shaped, wherein a diameter of the container continuously decreases from the top of the container to the bottom of the container.

16. The apparatus for processing substrates of claim 14, further comprising:
a plurality of baffles disposed within the container.

17. The apparatus for processing substrates of claim 14, wherein the processing volume includes a plurality of gas delivery zones, wherein the gas mixing apparatus comprises a corresponding plurality of outlets having conduits coupling respective outlets of the gas mixing apparatus to corresponding gas delivery zones of the processing volume.

* * * * *